United States Patent [19]
Mitani

[11] Patent Number: 5,929,672
[45] Date of Patent: Jul. 27, 1999

[54] POWER ON RESET CIRCUIT AND ONE CHIP MICROCOMPUTER USING SAME

[75] Inventor: Yoshiaki Mitani, Kyoto, Japan

[73] Assignee: Rohm Co., Ltd., Kyoto, Japan

[21] Appl. No.: 08/664,106

[22] Filed: Jun. 13, 1996

[30] Foreign Application Priority Data

Jun. 16, 1995 [JP] Japan ..................................... 7-150606

[51] Int. Cl.$^6$ ..................................................... H03L 7/00
[52] U.S. Cl. ........................................... 327/143; 327/198
[58] Field of Search ................................... 327/142, 143, 327/198

[56] References Cited

U.S. PATENT DOCUMENTS

| | | | |
|---|---|---|---|
| 4,528,629 | 7/1985 | Breitling | 364/431.11 |
| 4,591,745 | 5/1986 | Shen | 307/592 |
| 4,607,178 | 8/1986 | Sugie et al. | 307/594 |
| 4,611,126 | 9/1986 | Miller | 307/64 |
| 4,614,880 | 9/1986 | Go et al. | 307/200 |
| 4,886,984 | 12/1989 | Nakaoka | 307/296.4 |
| 5,479,132 | 12/1995 | Verhaeghe et al. | 327/553 |
| 5,578,951 | 11/1996 | Lee et al. | 327/143 |
| 5,721,502 | 2/1998 | Thomson et al. | 327/143 |

Primary Examiner—Timothy P. Callahan
Assistant Examiner—Jeffrey Zweizig
Attorney, Agent, or Firm—Majestic, Parsons, Siebert & Hsue, P.C.

[57] ABSTRACT

A power-on reset circuit incorporated in a semiconductor device, such as a one-chip microcomputer, includes a first capacitor and a second capacitor each having one of its electrodes grounded, a first switch circuit connecting the other electrode of the first capacitor to a voltage source, a second switch circuit connecting the electrode of the first capacitor connected to the voltage source to the other electrode of the second capacitor, a voltage detecting circuit which outputs a reset-releasing signal when the voltage of the second capacitor reaches a specified voltage level, and a discharge circuit having a first resistor and a diode connected in series between the second capacitor and the voltage source for discharging the second capacitor when the source voltage drops. There may further be provide an integrating circuit having a second resistor connected to the voltage detecting circuit and a third capacitor, an output circuit connected to the integration circuit and having a hysteresis characteristic and a third resistor connected between the second capacitor and the second switch circuit. A reset circuit thus structured can dependably output a reset signal at power-on but does not output such a reset signal when the source voltage drops momentarily during a normal operation for a time duration shorter than a specified short length of time.

20 Claims, 4 Drawing Sheets

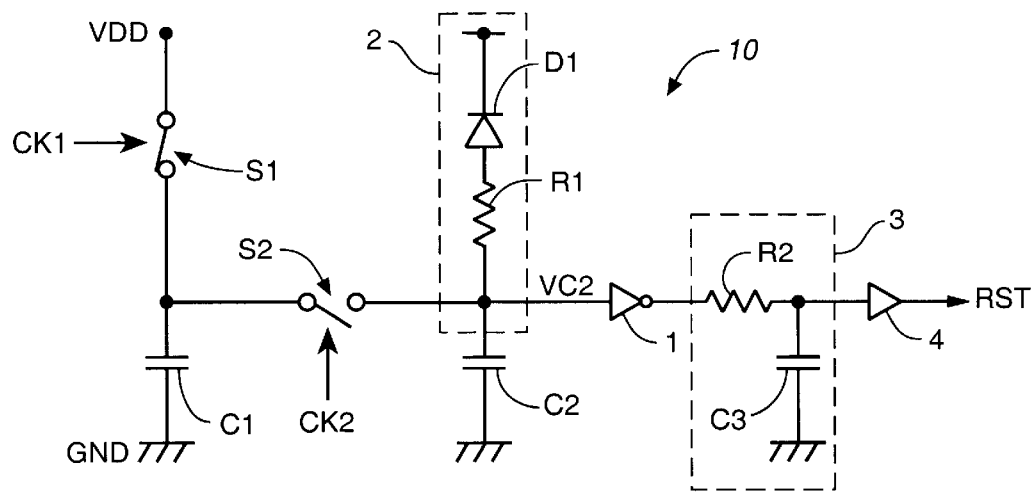
FIG._1
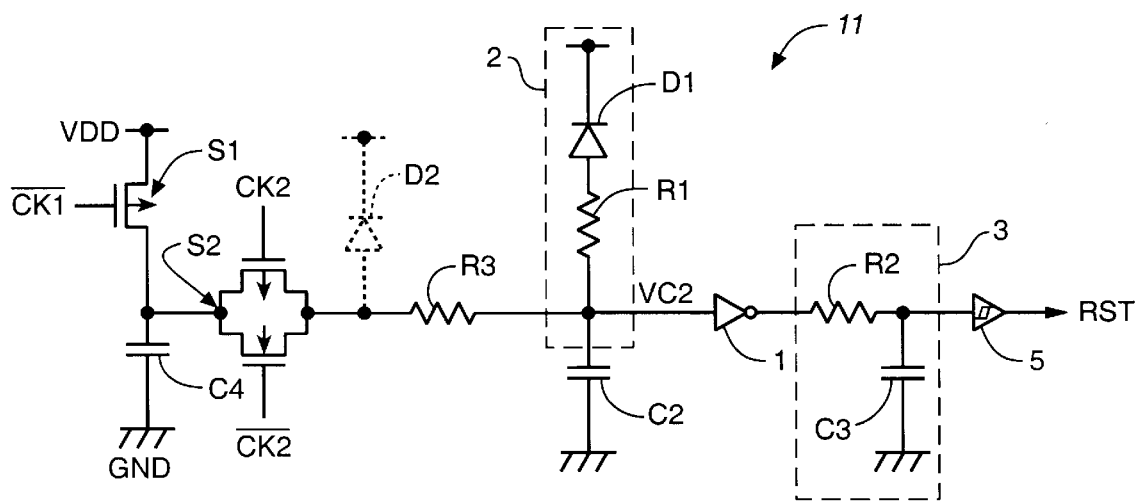
FIG._3

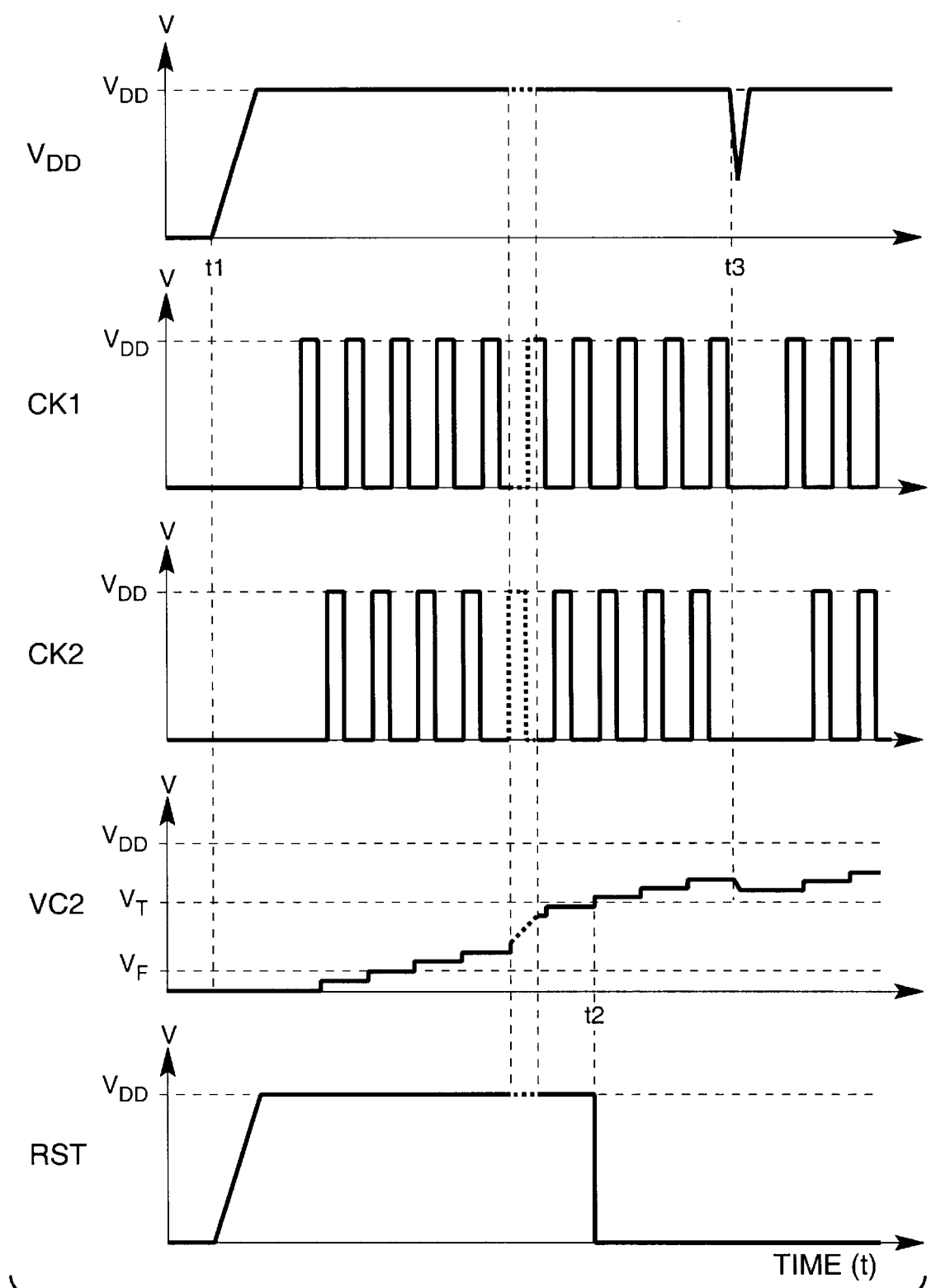
FIG._2

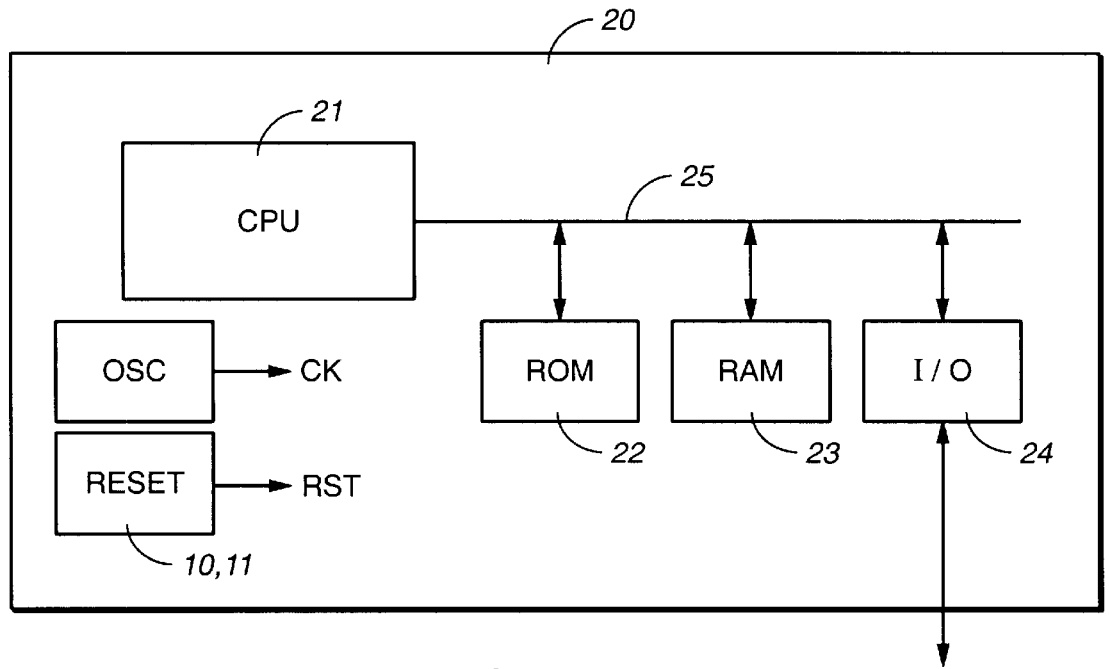
FIG._4
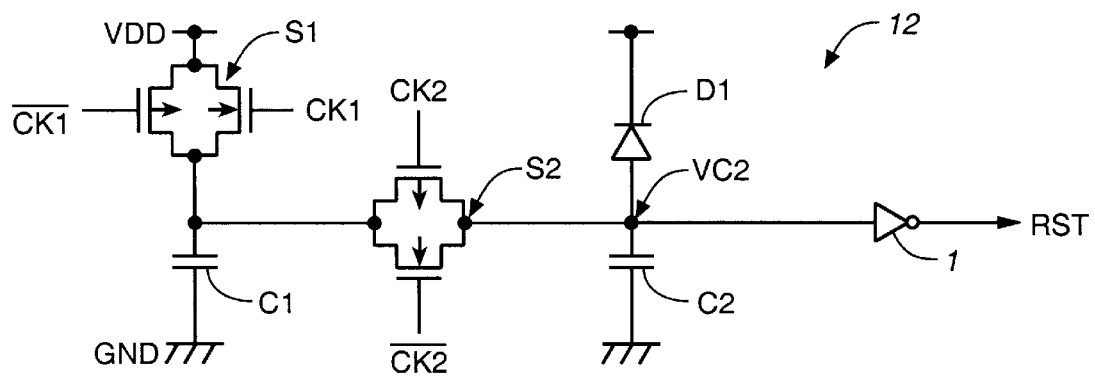
FIG._5
*(PRIOR ART)*

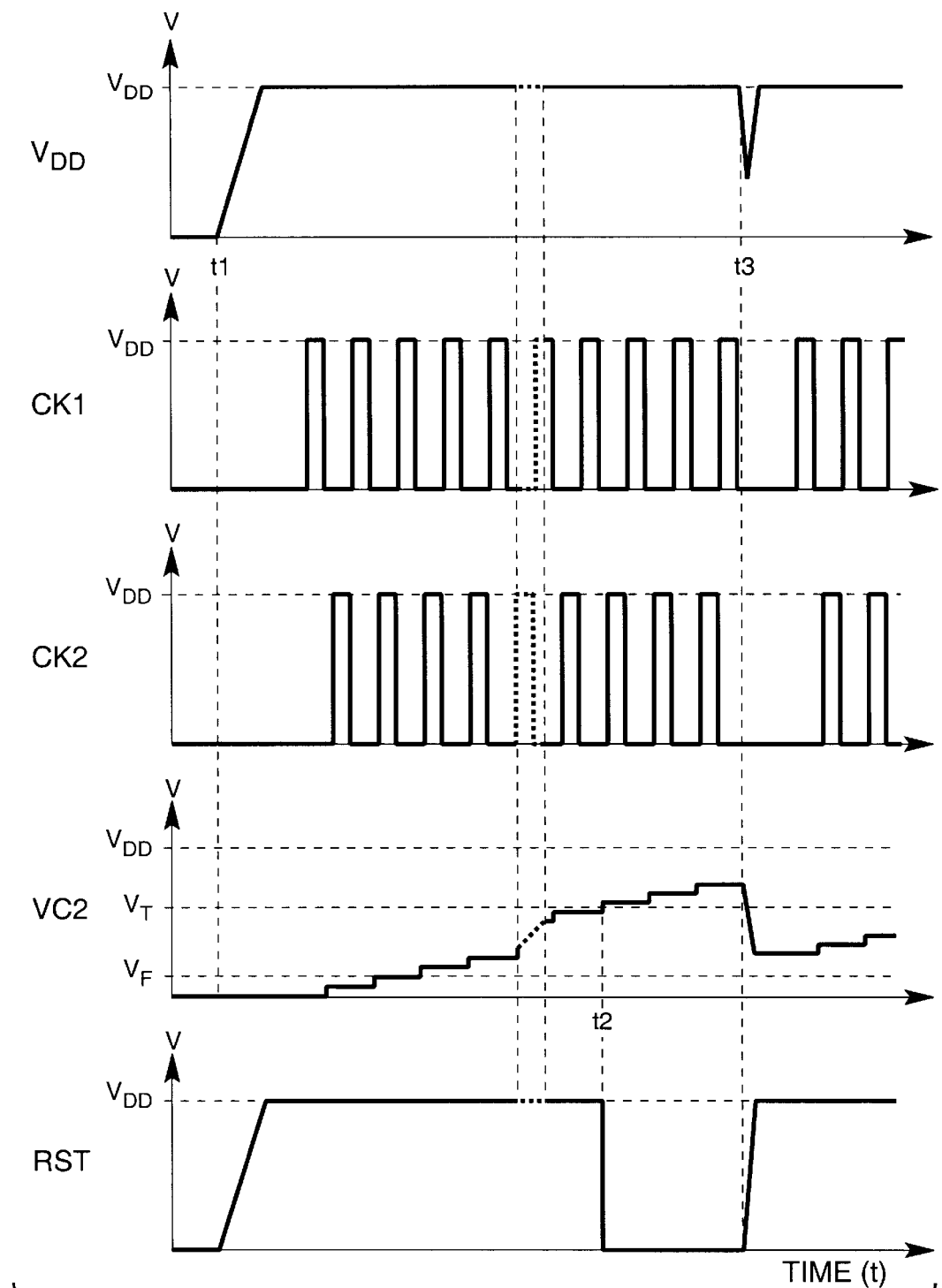
FIG._6
*(PRIOR ART)*

5,929,672

POWER ON RESET CIRCUIT AND ONE CHIP MICROCOMPUTER USING SAME

BACKGROUND OF THE INVENTION

This invention relates to a power-on reset circuit and more particularly to the structure of such a circuit. This invention additionally relates to a one-chip microcomputer using such a power-on reset circuit.

With a control unit comprising a prior art one-chip microcomputer used, for example, in acoustical or image-forming apparatus, the product as a whole frequently functions incorrectly or there is a runaway situation when the source voltage drops momentarily during the running of a program and returns thereafter to its normal level due, for example, to a power failure or a noise, as will be discussed below, because the internal condition of the control device after such an event is usually uncertain. In view of occurrences of this type, it has been known to use a power-on reset circuit, either incorporated internally or attached as an external device, to a semiconductor device such that the internal condition of the control device will be reset to a specified initial condition when the source is restored.

FIG. 5 shows an example of prior art power-on reset circuit 12 incorporated in a semiconductor device, and FIG. 6 is its waveform diagram. In what follows, the source voltage VDD will be sometimes referred to as "H", or the high level and the reference voltage as "L" or the low level.

With reference simultaneously to both FIGS. 5 and 6, capacitors C1 and C2, each having one of its electrodes maintained at the reference voltage (GND), are in a discharged condition before the source voltage (VDD) is applied to them at time t1, and their voltage is generally at the reference voltage "L". After the source voltage is applied at time t1, the voltage of capacitor C2 remains at the reference voltage "L" because of the principle of charge conservation, but the output signal RST of the voltage detecting circuit 1 becomes "H", thereby resetting the inner circuits of the semiconductor device (not shown). Thereafter, control signals CK1 and CK2 and their inversion signals $\overline{CK1}$ and $\overline{CK2}$ are alternately inputted as shown in FIG. 6 to analog switch circuits S1 and S2, respectively, from a timing circuit (not shown). Whenever either of the signals CK1 and CK2 is "H", the corresponding switch circuit S1 or S2 becomes conductive. When signal CK1 is "H" and signal CK2 is "L", for example, switch circuit S1 alone becomes conductive, causing capacitor C1 to be charged by the source voltage. When signal CK1 is "L" and signal CK2 is "H", on the other hand, switch circuit S2 alone becomes conductive, causing the charge on capacitor C1 to become distributed between the two capacitors C1 and C2.

As this process is repeated, the voltage VC2 of capacitor C2 gradually increases, approaching the source voltage. When, at time t2, the voltage VC2 of capacitor C2 finally exceeds the input (logic) threshold voltage VT of the voltage detecting circuit 1, the output voltage of the voltage detecting circuit 1 is inverted, becoming "L". The reset condition is thereby released, and the circuit is now ready for a normal operation. Thus, the power-on reset circuit 12 of FIG. 5, although compactly structured so as to be incorporated in a semiconductor circuit, is capable of providing a fairly long reset time without using any capacitor with a large capacitance.

A momentary drop in the source voltage, lasting several tens of milliseconds or less, sometimes takes place, as shown as happening at time t3 in FIG. 6, due, for example, to an external noise by a surge voltage applied externally of the semiconductor device or an internal noise generated within the semiconductor device such as when the internal circuits are activated together or when an output circuit drawing a large current was activated. When such a momentary drop takes place, the power-on reset circuit 12 instantaneously discharges the voltage charged to capacitor C2 through the diode D1 until the forward voltage VF of the diode D1 is reached, discharging gradually thereafter through leak currents or the like until the reference voltage is reached. If the voltage VC2 of capacitor C2 drops below the input threshold voltage VT even momentarily in such a situation, the RST output becomes "H" and the internal circuit is reset.

For this reason, even if the source voltage remains high enough to be able to keep the data in data-storing means for the semiconductor device, they are reset to their initial conditions, and the program operation cannot be resumed from the condition immediately prior to the momentary voltage drop.

SUMMARY OF THE INVENTION

It is therefore an object of this invention to overcome such a problem by providing an improved power-on reset circuit which outputs a reset signal dependably when a source voltage is switched on but does not output such a reset signal at the time of a momentary drop in the source voltage shorter than a specified momentary length of time.

A power-on reset circuit according to a first embodiment of this invention, with which the above and other objects can be accomplished, may be incorporated in a semiconductor device and is adapted to output a reset signal, when a source voltage is applied, so as to reset the semiconductor device in its initial condition until a capacitor is charged to a specified level, comprising a first capacitor and a second capacitor each having one electrode grounded, a first switch circuit connecting the other electrode of the first capacitor to a voltage source, a second switch circuit connecting the electrode of the first capacitor on the side of the voltage source to the other electrode of the second capacitor, a voltage detecting circuit adapted to output a reset-releasing signal when the voltage of the second capacitor reaches a specified voltage level, and a discharge circuit having a (first) resistor and a diode connected in series between the second capacitor and the voltage source for discharging the second capacitor in a time-controlled manner when the source voltage drops.

According to a second embodiment of the invention, the power-on reset circuit further comprises an integrating circuit having a second resistor connected to an output terminal of the voltage detecting circuit and a third capacitor, an output circuit connected to an output terminal of the integration circuit and having a hysteresis characteristic and a third resistor connected between the second capacitor and the second switch circuit.

A one-chip microcomputer according to this invention is characterized as incorporating internally a power-on reset circuit embodying this invention as described above.

With a power-on reset circuit thus structured, an unwanted reset signal for resetting internal circuits of the semiconductor device, in which it is incorporated, will be prevented from being outputted when the source voltage drops momentarily during a normal operation of the device, for example, by being affected by a noise.

BRIEF DESCRIPTION OF THE DRAWINGS

The accompanying drawings, which are incorporated in and form a part of this specification, illustrate embodiments of the invention and, together with the description, serve to explain the principles of the invention. In the drawings:

FIG. 1 is a circuit diagram of a power-on reset circuit according to a first embodiment of this invention;

FIG. 2 is a waveform diagram for explaining the operation of the circuit of FIG. 1;

FIG. 3 is a circuit diagram of another power-on reset circuit according to a second embodiment of this invention;

FIG. 4 is a schematic block diagram of a semiconductor device which may incorporate a power-on reset circuit according to this invention shown in FIGS. 1 or 3;

FIG. 5 is a circuit diagram of a prior art power-on reset circuit; and

FIG. 6 is a waveform diagram for explaining the operation of the prior art circuit of FIG. 5.

Throughout herein those components which are identical or substantially alike are indicated by the same symbol for simplifying the explanation of the disclosure.

DETAILED DESCRIPTION OF THE INVENTION

FIG. 1 shows the structure of a power-on reset circuit 10 embodying this invention, characterized as comprising a first capacitor (of a smaller capacitance) C1, a second capacitor (of a larger capacitance for gradually accumulating charge) C2, a first switch circuit S1, a second switch circuit S2, a voltage detecting circuit 1, a discharge circuit 2, an integrating circuit 3 and an output circuit 4. Both the first and second capacitors C1 and C2 have one of the electrodes connected to a reference voltage input terminal (or the ground GND). The other electrode of the first capacitor C1 is connected to a voltage source through the first switch circuit S1 and to the other electrode of the second capacitor C2 through the second switch circuit S2. The voltage detecting circuit 1 comprises a CMOS inverter circuit and serves to invert the output condition when the voltage VC2 of the second capacitor C2 varies and exceeds its input threshold VT. The discharge circuit 2 comprises a (first) resistor R1 and a diode D1 which are connected to each other in series and serves to discharge the second capacitor C2 towards the voltage source when the source voltages drops. The integrating circuit 3 is formed with a second resistor R2 and a third capacitor C3 and is connected to the output terminal of the voltage detecting circuit 1, serving as a low-pass filter and to eliminate the whisker-like pulses which may be generated at the output of the voltage detecting circuit 1 when the source voltage supplied to it fluctuates due, for example, to noise. The output circuit 4 serves as a buffer circuit for shaping waveforms of the output from the integrating circuit 3. Input terminals of the switch circuits S1 and S2 are connected to a timing circuit (not shown in FIG. 1) for opening and closing the switch circuits S1 and S2. As done according to prior art technology, analog switches by a PMOS or an NMOS element may be used for switch circuits S1 and S2.

Each of the capacitors may be formed between a dispersion layer and a wiring layer or between wiring layers. The first resistor R1 is formed with polysilicon such that there will not be any parasitic diode formed thereby. The voltage detecting circuit 1 may be formed with a NAND circuit, a NOR circuit or a comparator circuit. The reset time can be determined, according to the requirement, not only by adjusting the ratio of capacitance between the capacitors C1 and C2, say, by making the effective area of capacitor C2 several hundred times or several thousand times that of capacitor C1, but also by varying the clock frequency inputted for control and/or varying the input threshold voltage VT of the voltage detecting circuit 1 higher than the forward voltage VF of the diode D1.

FIG. 2 shows the waveforms at different parts of FIG. 1 for explaining the invention more completely. Let us assume again (as in the case of FIG. 6) that the source voltage is applied at time t1. The voltage of capacitor C2 remains "L" by the principle of charge conservation, as explained above, after the voltage of the RST output of the voltage detecting circuit 1 becomes "H", thereby resetting the internal circuits (not shown in FIG. 1) of the semiconductor. Thereafter, control signals CK1 and CK2 are alternately inputted to the switch circuits S1 and S2. Thus, only the first switch circuit S1 becomes conductive when CK1 is "H" and CK2 is "L" and the first capacitor C1 becomes charged by the source voltage. When CK1 is "L" and CK2 is "H", on the other hand, the second switch circuit S2 alone becomes conductive and the charge on the first capacitor C1 becomes distributed between the two capacitors C1 and C2. As such charging and charge-distributing operations are repeated, the voltage VC2 of the second capacitor C2 increases gradually, approaching the source voltage. When the voltage VC2 finally exceeds the input threshold voltage VT of the voltage detecting circuit 1 (at time t2 as shown in FIG. 2), the output voltage from the voltage detecting circuit 1 is inverted and becomes "L". A further delay is effected by the integrating circuit 3 and the reset condition is released, making it possible to carry out a normal operation by the device.

If there is a momentary drop in the source voltage with duration of less than several tens of milliseconds (as shown in FIG. 2 at time t3), say, due to a noise of a type discussed above, the second capacitor C2 would be discharged through the resistor R1 and the diode D1 at a specified time constant until its voltage becomes equal to the forward voltage of the diode D1, dropping thereafter gradually through element leaks until it reaches the reference voltage. If the momentary voltage drop is of a very short duration such that the voltage VC2 of the second capacitor C2 does not drop far enough to reach the level of the input threshold voltage VT of the voltage detecting circuit 1, however, the reset output RST is maintained at the level before the momentary voltage drop and the internal circuits are not reset again.

FIG. 3 shows another power-on reset circuit 11 according to this invention, characterized as forming its first switching circuit S1 only with a PMOS element because it serves only to switch on and off the source voltage, and forming its second switching circuit S2 as an analog switch comprising PMOS and NMOS transistors. A third resistor R3 comprising polysilicon is inserted between the switch circuit S2 and the second capacitor C2 in order to prevent discharge through the parasitic diode D2 of the switch circuit 2 indicated by dotted line in FIG. 3. The output terminal of the integrating circuit 3 is connected to an output circuit 5 having a hysteresis characteristic. C4 indicates parasitic capacitance due to connections and wiring of the first and second switching circuits S1 and S2. In other respects, the circuit shown in FIG. 3 is the same as that shown in FIG. 1 and hence functions generally similarly except, since the output voltage from the integrating circuit 3 has a hysteresis characteristic, its RST signals cannot be outputted repeatedly within a short period of time.

FIG. 4 shows a one-chip microcomputer 20 in which the power-on reset circuit 10 or 11 according to this invention is incorporated. Such a one-chip microcomputer 20 may include a central processing unit (CPU) 21 connected through a bus 25 to a read-only memory (ROM) 22 storing programs to be run by the CPU 21, a random access memory (RAM) 22 for temporarily storing data used in the program being run, an input-output interface (I/O) 24 through which input and output devices (not shown) may be connected. An oscillator means OSC for supplying clock (or timing) signals CK is shown only symbolically.

Although the invention has been described above with reference to only a limited number of embodiments, these illustrative embodiments are not intended to limit the scope of the invention. Many modifications and variations are possible within the scope of the invention. For example, a plurality of diodes may be connected in series in the discharge circuit, the integrating circuit 3 may be omitted, an RS latch circuit may be used in the output circuit 5, or the second capacitor C2 may be formed as an externally attached component. According to a preferred embodiment of the invention, resistors with resistance of several 10 k$\Omega$ to several M$\Omega$ are used as the resistors R1 and R3, a capacitor with capacitance of several pF as the first capacitor C1 and a capacitor with capacitance of several hundred to several thousand pF as the second capacitor C2 such that the circuit will not respond to a momentary drop in the source voltage with duration shorter than several tens of milliseconds. Although power-on reset circuits for use in a one-chip CMOS microcomputer has been shown, it goes without saying that similar circuits can be formed also for semiconductor devices using the bipolar technology. In summary, power-on reset circuits according to this invention do not output a reset signal to a semiconductor device when the source voltage drops momentarily during a normal operation of the device to a level at which the data in memory means can be maintained such that the operation can be continued in spite of such a momentary voltage drop.

What is claimed is:

1. A power-on reset circuit which can be incorporated in a semiconductor device for outputting a reset signal for resetting said semiconductor in an initial condition for a specified capacitor-charging period of time when a source voltage is applied, said power-on reset circuit comprising:

a first capacitor having a grounded electrode and a source electrode;

a second capacitor having a grounded electrode and a source electrode;

a first switch circuit connected between the source electrode of said first capacitor and a voltage source;

a second switch circuit connecting the source electrodes of said first and second capacitors;

a voltage detecting circuit adapted to output a reset-releasing signal when the voltage of said second capacitor reaches a specified threshold voltage; and a discharge circuit comprising a resistor and a diode connected in series for discharging said second capacitor when there is a drop in said source voltage;

wherein a momentary drop in said source voltage of less than a specified duration during a normal operation of said semiconductor device does not cause said reset signal to be outputted from said power-on reset circuit.

2. The power-on reset circuit of claim 1 wherein said resistor has resistance of several 10 k$\Omega$ to several M$\Omega$, said first capacitor has capacitance of several pF, and said second capacitor has capacitance of several hundred to several thousand pF.

3. The power-on reset circuit of claim 1 wherein said specified duration is several tens of milliseconds.

4. The power-on reset circuit of claim 1 wherein said resistor comprises polysilicon and does not cause any parasitic diode to be formed thereby.

5. The power-on reset circuit of claim 1 further comprising:

an integrating circuit including a second resistor connected to said voltage detecting circuit and a third capacitor;

an output circuit having a hysteresis characteristic and being connected to said integrating circuit; and a third resistor connected between said second capacitor and said second switch circuit.

6. The power-on reset circuit of claim 5 wherein said integrating circuit is connected so as to receive output signals from said voltage detecting circuit through said second resistor and said output circuit is adapted to receive signals outputted from said integrating circuit.

7. The power-on reset circuit of claim 2 further comprising:

an integrating circuit including a second resistor connected to said voltage detecting circuit and a third capacitor;

an output circuit having a hysteresis characteristic and being connected to said integrating circuit; and a third resistor connected between said second capacitor and said second switch circuit.

8. The power-on reset circuit of claim 7 wherein said integrating circuit is connected so as to receive output signals from said voltage detecting circuit through said second resistor and said output circuit is adapted to receive signals outputted from said integrating circuit.

9. The power-on reset circuit of claim 7 wherein said third resistor has resistance of several 10 k$\Omega$ to several M$\Omega$.

10. The power-on reset circuit of claim 1 wherein said voltage-detecting circuit comprises a CMOS inverter circuit adapted to invert output condition thereof when the voltage of said second capacitor reaches said threshold voltage.

11. A one-chip microcomputer comprising:

a central processing unit;

memory means for storing data connected to said central processing unit;

a power-on reset circuit incorporated on a single chip with said central processing unit and said memory means for outputting a reset signal for resetting said central processing means in an initial condition for a specified capacitor-charging period of time when a source voltage is applied, said power-on reset circuit comprising:

a first capacitor having a grounded electrode and a source electrode;

a second capacitor having a grounded electrode and a source electrode;

a first switch circuit connected between the source electrode of said first capacitor and a voltage source;

a second switch circuit connecting the source electrodes of said first and second capacitors;

a voltage detecting circuit adapted to output a reset-releasing signal when the voltage of said second capacitor reaches a specified threshold voltage; and a discharge circuit comprising a resistor and a diode connected in series for discharging said second capacitor when there is a drop in said source voltage;

wherein a momentary drop in said source voltage of less than a specified duration during a normal operation of said semiconductor device does not cause said reset signal to be outputted from said power-on reset circuit.

12. The one-chip microcomputer claim 11 wherein said resistor has resistance of several 10 k$\Omega$ to several M$\Omega$, said first capacitor has capacitance of several pF, and said second capacitor has capacitance of several hundred to several thousand pF.

13. The one-chip microcomputer of claim 11 wherein said specified duration is several tens of milliseconds.

14. The one-chip microcomputer of claim 11 wherein said resistor comprises polysilicon and does not cause any parasitic diode to be formed thereby.

15. The one-chip microcomputer of claim 11 further comprising:
   an integrating circuit including a second resistor connected to said voltage detecting circuit and a third capacitor;
   an output circuit having a hysteresis characteristic and being connected to said integrating circuit; and
   a third resistor connected between said second capacitor and said second switch circuit.

16. The one-chip microcomputer of claim 15 wherein said integrating circuit is connected so as to receive output signals from said voltage detecting circuit through said second resistor and said output circuit is adapted to receive signals outputted from said integrating circuit.

17. The one-chip microcomputer of claim 12 further comprising:
   an integrating circuit including a second resistor connected to said voltage detecting circuit and a third capacitor;
   an output circuit having a hysteresis characteristic and being connected to said integrating circuit; and
   a third resistor connected between said second capacitor and said second switch circuit.

18. The one-chip microcomputer of claim 17 wherein said integrating circuit is connected so as to receive output signals from said voltage detecting circuit through said second resistor and said output circuit is adapted to receive signals outputted from said integrating circuit.

19. The one-chip microcomputer of claim 17 wherein said third resistor has resistance of several 10 k$\Omega$ to several M$\Omega$.

20. The one-chip microcomputer of claim 11 wherein said voltage-detecting circuit comprises a CMOS inverter circuit adapted to invert output condition thereof when the voltage of said second capacitor reaches said threshold voltage.

* * * * *